(12) United States Patent
Ota et al.

(10) Patent No.: US 8,044,482 B2
(45) Date of Patent: Oct. 25, 2011

(54) SEMICONDUCTOR DEVICE

(75) Inventors: Yukitoshi Ota, Osaka (JP); Hiroshige Hirano, Nara (JP); Yutaka Itou, Kyoto (JP); Koji Koike, Kyoto (JP)

(73) Assignee: Panasonic Corporation, Osaka (JP)

( * ) Notice: Subject to any disclaimer, the term of this patent is extended or adjusted under 35 U.S.C. 154(b) by 15 days.

(21) Appl. No.: 12/540,043

(22) Filed: Aug. 12, 2009

(65) Prior Publication Data
US 2010/0090344 A1  Apr. 15, 2010

(30) Foreign Application Priority Data

Oct. 10, 2008 (JP) ................. 2008-263592

(51) Int. Cl.
*H01L 21/44* (2006.01)
*H01L 31/00* (2006.01)
*H01L 29/40* (2006.01)
(52) U.S. Cl. .............. 257/459; 257/758; 438/612
(58) Field of Classification Search ............ 438/612, 438/622; 257/459, 758
See application file for complete search history.

(56) References Cited

U.S. PATENT DOCUMENTS

| 6,747,355 | B2 | 6/2004 | Abiru et al. | |
|---|---|---|---|---|
| 7,312,530 | B2 | 12/2007 | Hashimoto et al. | |
| 7,955,973 | B2* | 6/2011 | Zecri | 438/666 |
| 2004/0150069 | A1* | 8/2004 | Low et al. | 257/508 |
| 2006/0097396 | A1 | 5/2006 | Kamiyama et al. | |
| 2006/0267008 | A1* | 11/2006 | Tsao et al. | 257/48 |
| 2007/0007655 | A1 | 1/2007 | Miyamori | |
| 2007/0096320 | A1 | 5/2007 | Takemura et al. | |
| 2007/0114668 | A1* | 5/2007 | Goto et al. | 257/758 |
| 2008/0217786 | A1* | 9/2008 | Kasaoka et al. | 257/773 |
| 2008/0290516 | A1* | 11/2008 | Oda | 257/751 |
| 2010/0159690 | A1* | 6/2010 | Kasaoka et al. | 438/612 |

FOREIGN PATENT DOCUMENTS

| JP | 2004-363340 | 12/2004 |
|---|---|---|
| JP | 2007-123546 | 5/2007 |
| WO | WO2008/015500 | * 2/2008 |

* cited by examiner

*Primary Examiner* — James Mitchell
(74) *Attorney, Agent, or Firm* — McDermott Will & Emery LLP

(57) ABSTRACT

A semiconductor device includes an insulating film formed on a semiconductor substrate, a contact wiring formed in the insulating film, a protective film formed on the contact wiring and the insulating film, an opening portion formed in the protective film, the contact wiring being exposed through the opening portion, and an electrode pad formed in the opening portion, the electrode pad being electrically connected to the contact wiring. A region where the contact wiring is not provided is present below the opening portion.

13 Claims, 7 Drawing Sheets

SEMICONDUCTOR DEVICE

CROSS REFERENCE TO RELATED APPLICATION

This application claims priority to Japanese Patent Application No. 2008-263592 filed on Oct. 10, 2008, the disclosure of which including the specification, the drawings, and the claims is hereby incorporated by reference in its entirety.

BACKGROUND

The present disclosure relates to an electrode pad structure for semiconductor devices.

In recent years, there is a demand for a reduction in height of a chip including a wiring layer of a CCD (charge coupled device) or an imaging sensor in view of a relationship between the height and an optical characteristic thereof, in addition to improvements in function and scale of integration of a semiconductor device. Therefore, it is necessary to reduce the thickness of the wiring layer as well in the future. Wirings may be made of Cu in a state-of-the-art process. In this case, a Cu film is formed by plating before removal by Chemical Mechanical Polishing (CMP).

FIG. 7 is a cross-sectional view of a conventional semiconductor device having an electrode pad structure disclosed in Japanese Unexamined Patent Application Publication No. 2007-123546. As shown in FIG. 7, a first insulating film 102 is formed on a semiconductor substrate 101, and a second insulating film 103 and a first layer Cu wiring 104 are formed on the first insulating film 102. A third insulating film 105, and Cu connection vias 106 contacting the first layer Cu wiring 104 are formed on the second insulating film 103 and the first layer Cu wiring 104. A fourth insulating film 107, and a second layer Cu wiring 108 contacting the Cu connection vias 106 are formed on the third insulating film 105 and the Cu connection vias 106. A fifth insulating film 109, and Cu connection vias 110 contacting the second layer Cu wiring 108 are formed on the fourth insulating film 107 and the second layer Cu wiring 108. A sixth insulating film 111, and an uppermost layer Cu pad 112 contacting the Cu connection vias 110 are formed on the fifth insulating film 109 and the Cu connection vias 110. A passivation film 113 is formed on the sixth insulating film 111 and the uppermost layer Cu pad 112. An opening 114 through which a center portion of the uppermost layer Cu pad 112 is exposed is formed in the passivation film 113. An Al pad 116 is formed on the uppermost layer Cu pad 112 exposed in the opening 114 and the passivation film 113 around the opening 114 with a barrier film 115 being interposed therebetween. A tip of a bonding wire (not shown) is connected to the Al pad 116.

SUMMARY

As described above, in a CCD or an imaging sensor, it is necessary to reduce the height of the entire device so as to improve an optical characteristic thereof, i.e., it is also necessary to reduce the thickness of the Cu wiring layer. However, in the conventional semiconductor device of FIG. 7, when the thickness of the Cu wiring layer, particularly the uppermost layer Cu pad 112, is reduced, dishing occurs during CMP due to the large area of the uppermost layer Cu pad 112, and as a result, a center portion of the uppermost layer Cu pad 112 is removed, and therefore, sufficient electrical connection is not provided between the uppermost layer Cu pad 112 and the Al pad 116, which is a problem.

In view of the aforementioned problem, an object of the present disclosure is to reliably prevent a wiring layer from being removed from an electrode pad formation region even when the thickness of a wiring layer made of Cu or the like is reduced, whereby the wiring layer and an electrode pad can be stably electrically connected.

To achieve the object, a semiconductor device includes an insulating film formed on a semiconductor substrate, a contact wiring formed in the insulating film, a protective film formed on the contact wiring and the insulating film, an opening portion formed in the protective film, the contact wiring being exposed through the opening portion, and an electrode pad formed in the opening portion, the electrode pad being electrically connected to the contact wiring. A region where the contact wiring is not provided is present below the opening portion.

Specifically, whereas a contact wiring is provided in an entire region below an insulating film opening portion in which an electrode pad is formed in conventional semiconductor devices, a contact wiring is formed in a portion of a region below an insulating film opening portion in which an electrode pad is formed in the semiconductor device of the present disclosure.

Therefore, according to the semiconductor device of the present disclosure, an area ratio of the contact wiring (a ratio of an area of the contact wiring to a predetermined area (e.g., an area of the insulating film opening portion)) can be caused to be smaller than that of conventional semiconductor devices. Therefore, the amount of dishing which is caused during formation of the contact wiring can be suppressed, thereby allowing the contact wiring to have a sufficient thickness. As a result, the contact wiring and the electrode pad can be stably electrically connected.

Note that, in the semiconductor device of the present disclosure, when a portion of the electrode pad which is located above the region where the contact wiring is not provided is used as a probe inspection region or a wire bonding connection region, the insulating film below the region has a larger total thickness than that of a region where the contact wiring is provided. Therefore, it is possible to reduce stress applied on the electrode pad when probe inspection or wire bonding connection is performed, and therefore, it is possible to prevent a crack from occurring in the electrode pad. Specifically, a probe inspection region or a wire bonding connection region may be set in a portion of the electrode pad which is located at a center of the opening portion.

In the semiconductor device of the present disclosure, a plurality of the contact wirings may be provided below the opening portion.

In the semiconductor device of the present disclosure, when at least one of the contact wirings is in the shape of a ring, then if the ring-shaped contact wiring is arranged along an edge of the opening portion, the following effect can be obtained. Specifically, when probe inspection is performed with respect to the electrode pad, then even if a crack occurs in the electrode pad and moisture intrudes through the crack, the ring-shaped contact wiring can prevent the moisture from intruding further inside the chip. Therefore, the moisture resistance of the device can be ensured.

In the semiconductor device of the present disclosure, when the ring-shaped contact wiring is arranged in a manner which allows it to overlap an edge of the opening portion, the ring-shaped contact wiring functions as an etch-stop during formation of the opening portion. Therefore, a step below the edge of the opening portion can be reduced, and therefore, the coverage of a barrier metal film between the electrode pad and the contact wirings, and the coverage of a metal film included in the electrode pad can be improved. Therefore, it is possible to prevent a crack from occurring in the electrode pad, and in addition, it is possible to prevent a component metal of the contact wirings from precipitating to the electrode pad, i.e., it is possible to prevent corrosion of the electrode pad.

In the semiconductor device of the present disclosure, when the plurality of contact wirings are arranged in a manner which allows it not to overlap an edge of the opening portion, a surface of the underlying insulating film is etched during formation of the opening portion. Therefore, a step below the edge of the opening portion becomes large. As a result, the coverage of a barrier metal film between the contact wirings and the electrode pad is degraded, however, the absence of a contact wiring below the edge of the opening portion makes it possible to prevent a component metal of the contact wirings from precipitating to the electrode pad, i.e., it is possible to prevent corrosion of the electrode pad.

In the semiconductor device of the present disclosure, the plurality of contact wirings may include a first contact wiring, and a second contact wiring smaller than the first contact wiring. In other words, the contact wirings may have different areas. Moreover, in this case, if the first contact wiring is provided below a peripheral portion of the opening portion and the second contact wiring is provided below a center portion of the opening portion (i.e., a relatively small contact wiring is provided below a center portion of the opening portion), the following effect can be obtained. Specifically, when the opening portion is formed, a surface portion of the insulating film around the contact wirings is removed by etching, so that an upper portion of each contact wiring protrudes from the insulating film. Therefore, a protruding portion corresponding to an underlying shape is formed in a surface of the electrode pad above each protruding contact wiring. Therefore, if a plurality of relatively small contact wirings are provided below a center of the opening portion, a large number of minute recess portions are generated in a surface of the electrode pad at a center of the opening portion due to a step between the contact wirings and the insulating film therearound. Therefore, by connecting a bonding wire to the surface of the electrode pad at the center of the opening portion, adhesiveness between the electrode pad and the bonding wire can be improved.

In the semiconductor device of the present disclosure, when at least one of the plurality of contact wirings is in the shape of a rectangle whose corner portions are beveled, the following effect can be obtained. Specifically, when the opening portion is formed, a surface portion of the insulating film around each contact wiring is slightly etched. However, if the corner portions of each contact wiring are beveled, it is possible to prevent an acute angle portion from occurring in a step-like shape caused by the etching, resulting in an improvement in the coverage of a barrier film between the electrode pad and the contact wirings or the coverage of a metal film included in the electrode pad. Therefore, it is possible to prevent a crack from occurring in the electrode pad, and in addition, it is possible to prevent a component metal of the contact wirings from precipitating to the electrode pad, i.e., it is possible to prevent corrosion of the electrode pad.

In the semiconductor device of the present disclosure, a lower-layer wiring may be formed between the semiconductor substrate and the insulating film, and the contact wiring and the lower-layer wiring may be connected with a via.

In the semiconductor device of the present disclosure, the contact wiring may be made of copper or a copper alloy, and the electrode pad may be made of aluminum or an aluminum alloy.

As described above, the present disclosure relates to the electrode pad structure of a semiconductor device. Particularly, when the present disclosure is applied to a pad structure having a thin wiring layer, the amount of dishing during formation of contact wirings is suppressed to ensure a sufficient thickness of each contact wiring. As a result, the contact wirings and the electrode pad can be stably electrically connected. Therefore, the present disclosure is considerably useful.

DETAILED DESCRIPTION

First Embodiment

Hereinafter, a semiconductor device according to a first embodiment of the present disclosure will be described with reference to the accompanying drawings.

Figure 1:
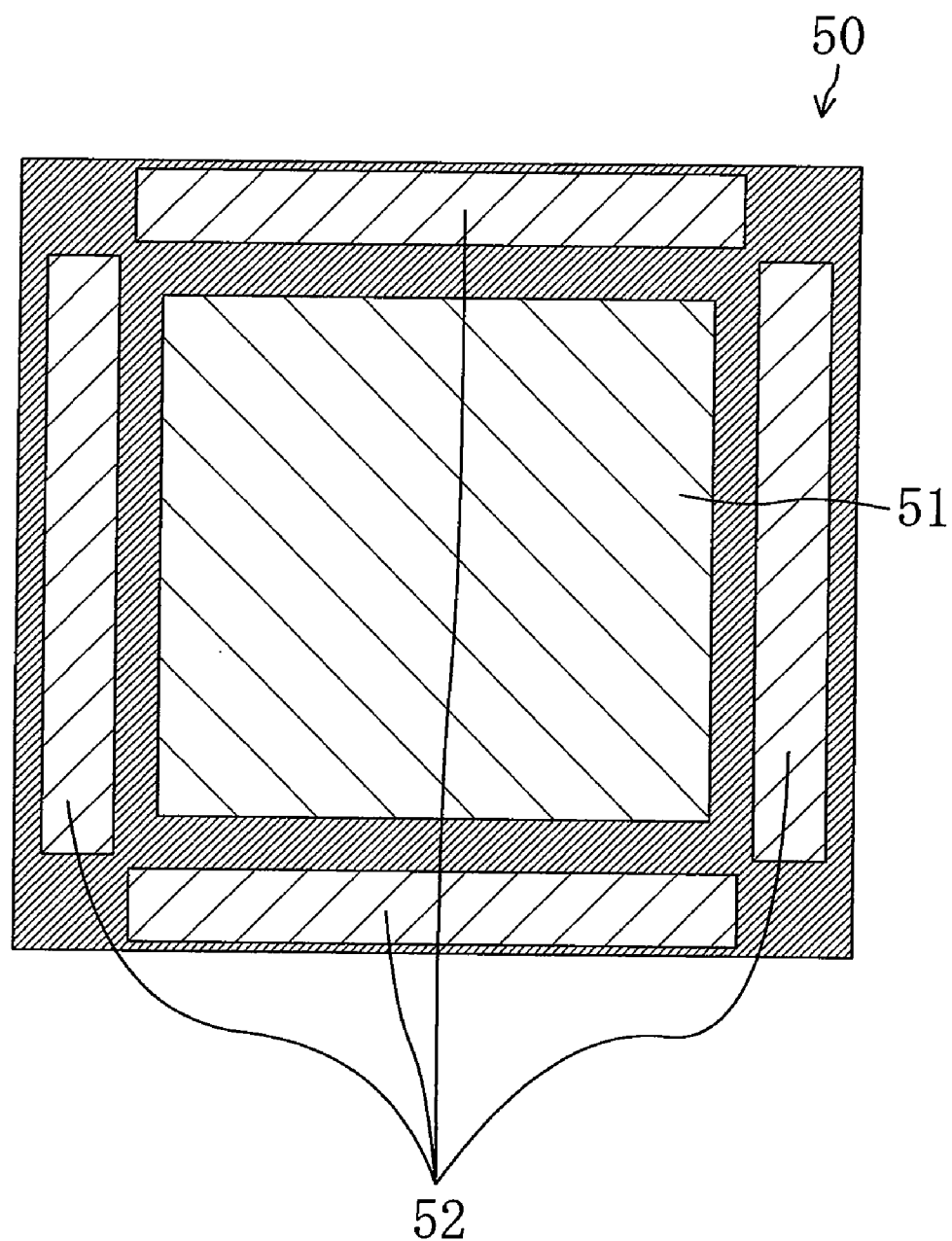
FIG. 1 is a plan view showing an overall configuration of a semiconductor device according to a first embodiment of the present disclosure.

FIG. 1 is a plan view showing an overall configuration of the semiconductor device of the first embodiment. The semiconductor device 50 of FIG. 1 has a cell region 51 for a CCD, an imaging sensor or the like which is provided at a center portion of the device, and pad arrangement regions 52 provided at a peripheral portion of the device. Note that, in the semiconductor device 50 of FIG. 1, the pad arrangement regions 52 are provided along four sides of the device. Alternatively, when the number of pads is small, the pad arrangement regions 52 may be provided along two sides of the device. Alternatively, when the number of pads is large, pads may be arranged in two stages in each pad arrangement region 52. In this case, the pads may be arranged in a staggered manner.

In the semiconductor device 50 of this embodiment, a height of the device needs to be reduced so as to ensure a satisfactory optical characteristic of a CCD, an imaging sensor or the like provided in the cell region 51. Therefore, it is necessary to reduce a thickness of the wiring layer as well, which may lead to a malfunction. To prevent this, a pad structure according to the present disclosure described below is applied.

Figure 2A:
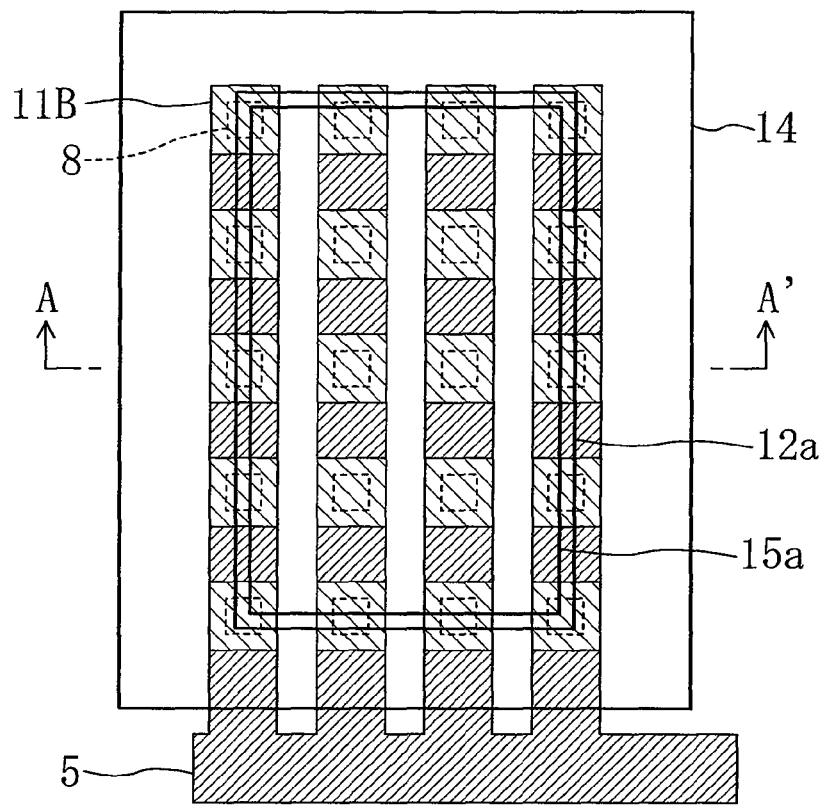
FIGS. 2A and 2B are a plan view and a cross-sectional view showing a pad structure for the semiconductor device of the first embodiment, respectively.
Figure 2B:
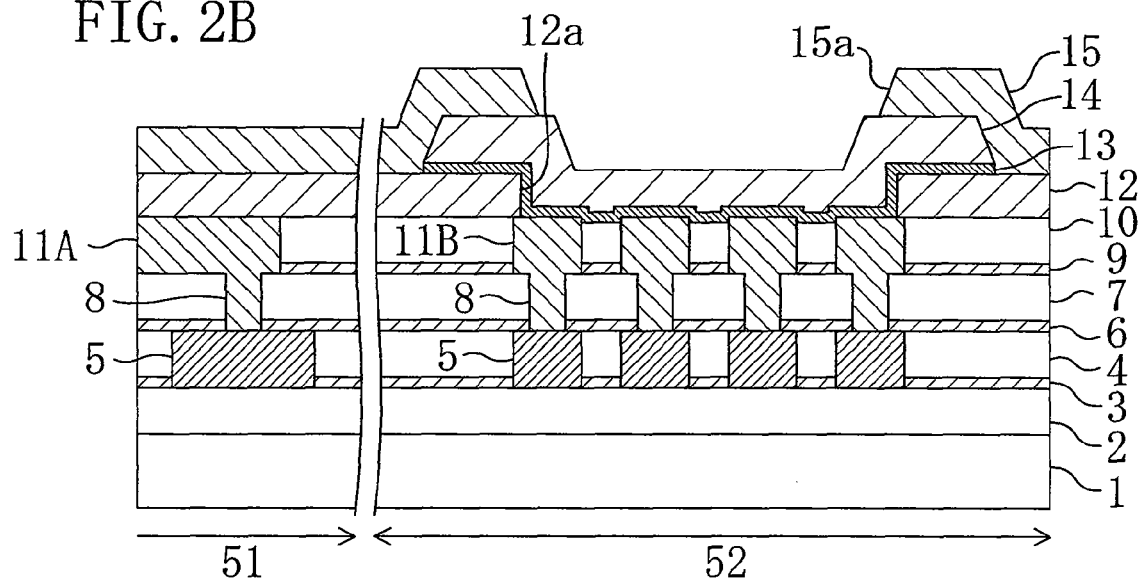

FIGS. 2A and 2B are a plan view and a cross-sectional view showing a pad structure for the semiconductor device of this embodiment, respectively. Note that FIG. 2A mainly shows a wiring structure below an electrode pad. FIG. 2B shows a cross-sectional structure taken along line A-A' of FIG. 2A (a cross-sectional structure of the pad arrangement region 52), and in addition, a cross-sectional structure of a portion of the cell region 51.

As shown in FIGS. 2A and 2B, a first inter-layer insulating film 2 made of, for example, $SiO_2$ is formed on a semiconductor substrate 1 on which pixel elements, transistors and the like (all not shown) of an imaging sensor are formed. A second inter-layer insulating film 4 made of, for example, $SiO_2$, is formed on the first inter-layer insulating film 2 with a first underlying insulating film 3 made of, for example, SiN being interposed therebetween. A lower-layer wiring 5 made of, for example, copper is formed in the first underlying insulating film 3 and the second inter-layer insulating film 4. A third inter-layer insulating film 7 made of, for example, $SiO_2$ is formed on the lower-layer wiring 5 and the second inter-layer insulating film 4 with a second underlying insulating film 6 made of, for example, SiN is interposed therebetween. Via plugs 8 which are made of, for example, copper and contact the lower-layer wiring 5 are formed in the second underlying insulating film 6 and the third inter-layer insulating film 7. A fourth inter-layer insulating film 10 made of, for example, $SiO_2$ is formed on the via plugs 8 and the third inter-layer insulating film 7 with a third underlying insulating film 9 made of, for example, SiN being interposed therebetween. An upper-layer wiring 11A which is made of, for example, copper and contacts a via plug 8 is formed in portions of the third underlying insulating film 9 and the fourth inter-layer insulating film 10 which are located in the cell region 51. A plurality of rectangle-shaped contact wirings 11B which are made of, for example, copper and contact via plugs 8 are formed in portions of the third underlying insulating film 9 and the fourth inter-layer insulating film 10 which are located in the pad arrangement region 52. A first protective insulating film 12 made of, for example, SiN is formed on the contact wirings 11B and the fourth inter-layer insulating film 10. A first opening portion 12a through which the contact wirings 11B are exposed is formed in the first protective insulating film 12. An electrode pad 14 made of, for example, aluminum is formed in the first opening portion 12a and on a portion of the first protective insulating film 12 which is located in the vicinity of the first opening portion 12a, with a barrier metal film 13 having a multilayer structure including, for example, a TiN film and a Ti film being interposed therebetween. In other words, the electrode pad 14 is electrically connected via the barrier metal film 13 to each contact wiring 11B. A second protective insulating film 15 made of, for example, SiN is formed on the electrode pad 14 and the first protective insulating film 12. A second opening portion 15a through which the electrode pad 14 is exposed is formed in the second protective insulating film 15.

Note that the lower-layer wiring 5 is formed as follows. Initially, a wiring trench is formed by performing patterning with respect to the first underlying insulating film 3 and the second inter-layer insulating film 4 by etching. Thereafter, a barrier metal film having a multilayer structure including, for example, a TaN film and a Ta film, and a Cu seed layer are successively formed on a wall surface and a bottom surface of the wiring trench. Thereafter, a Cu film is formed by plating to fill the wiring trench. Next, a portion of the Cu film or the like overflowing from the wiring trench is removed by CMP. Thus, the lower-layer wiring 5 is formed.

The via plugs 8, and the upper-layer wiring 11A and the contact wirings 11B are formed as follows. Initially, patterning is performed with respect to the second underlying insulating film 6, the third inter-layer insulating film 7, the third underlying insulating film 9 and the fourth inter-layer insulating film 10 by etching to form vias. Thereafter, patterning is performed with respect to the third underlying insulating film 9 and the fourth inter-layer insulating film 10 by etching to form a wiring trench contacting the vias. Thereafter, a barrier metal film having a multilayer structure including, for example, a TaN film and a Ta film, and a Cu seed layer are successively formed on wall surfaces and bottom surfaces of the vias and the wiring trench. Thereafter, a Cu film is formed by plating to fill the vias and the wiring trench. Thereafter, a portion of the Cu film or the like overflowing from the wiring trench is removed by CMP. As a result, the via plugs 8, and the upper-layer wiring 11A and the contact wirings 11B connected to the via plugs 8 are formed. In other words, the upper-layer wiring 11A and a via plug 8 connected thereto are integrally formed, and the contact wirings 11B and via plugs 8 connected thereto are integrally formed.

A characteristic feature of this embodiment is that, as shown in FIGS. 2A and 2B, there is a region where no contact wiring 11B is provided, below the first opening portion 12a of the first protective insulating film 12 in which the electrode pad 14 is formed. Specifically, whereas a single contact wiring is provided in an entire region below the insulating film opening portion in which an electrode pad is formed in conventional semiconductor devices, the contact wirings 11B are formed in a portion of a region below the first opening portion 12a of the first protective insulating film 12 in the semiconductor device of this embodiment. Specifically, in this embodiment, a plurality of rectangle-shaped contact wirings 11B are formed instead of a conventional single contact wiring. Here, each contact wiring 11B is surrounded by the third underlying insulating film 9 and the fourth inter-layer insulating film 10. Each contact wiring 11B has a size of, for example, 3 μm×3 μm.

Note that FIGS. 2A and 2B show how twenty (4×5) contact wirings 11B are arranged in a region which is slightly larger than the first opening portion 12a of the first protective insulating film 12 in which the electrode pad 14 is formed. However, actually, if it is assumed that the first opening portion 12a (i.e., the electrode pad 14) has a size of about 50 to 100 μm×50 to 100 μm, and the contact wirings 11B each have a size of, for example, 3 μm×3 μm are arranged with a pitch of 4 μm, about several hundreds (12 to 25×12 to 25) of the contact wirings 11B are provided.

Also, in this embodiment, all the contact wirings 11B are electrically connected via the via plugs 8 to the lower-layer wiring 5. Specifically, as shown in FIG. 2A, the lower-layer wiring 5 has a comb-shaped wiring portion corresponding to a plurality of lines of contact wirings 11B in one direction. The lower-layer wiring 5 is electrically connected via the via plugs 8 in the comb-like wiring portion to the contact wirings 11B. In other words, in this embodiment, all the contact wirings 11B are connected to a single common node.

According to this embodiment, an area ratio of the contact wirings 11B (a ratio of an area of the contact wirings 11B to a predetermined area (e.g., an area of the first opening portion 12a of the first protective insulating film 12)) can be caused to be smaller than that of conventional semiconductor devices. In addition, each contact wiring 11B can be surrounded by the third underlying insulating film 9 and the fourth inter-layer insulating film 10. Therefore, the amount of dishing which is caused by CMP during formation of the contact wirings 11B can be suppressed, thereby allowing the contact wirings 11B to have a sufficient thickness. Specifically, in this embodiment, although the thickness (target value) of the contact wirings 11B is, for example, about 200 nm, a conductive film (e.g., a Cu film) of which the contact wirings 11B are made of is not removed. Therefore, it is possible to stably electrically connect the contact wirings 11B and the electrode pad 14.

Note that, in this embodiment, the area ratio of the contact wirings 11B is preferably 70% or less, more preferably 50% or less. Moreover, although a plurality of contact wirings 11B are provided below the first opening portion 12a of the first protective insulating film 12 in which the electrode pad 14 is formed, a single contact wiring 11B having any shape may be provided below the first opening portion 12a, assuming that there is a region where no contact wiring 11B is provided below the first opening portion 12a.

Also, in this embodiment, the contact wirings 11B may be, for example, rearranged or spaced apart to expand a region where no contact wiring 11B is provided of an opening portion (the first opening portion 12a of the first protective insulating film 12), and a portion of the electrode pad 14 which is located above the expanded region may be used as a probe inspection region or a wire bonding connection region. For example, one or a plurality of (not all) lines of the comb-shaped wiring portion of the lower-layer wiring 5 shown in FIG. 2A may be spaced apart along with contact wirings 11B. Thus, by using a portion of the electrode pad 14 which is located above a region where no contact wiring 11B is provided as a probe inspection region or a wire bonding connection region, the following effect can be obtained. Specifically, a region where no contact wiring 11B is provided has a larger total thickness of the insulating film than that of a region where a contact wiring 11B is provided, and therefore, can reduce stress on the electrode pad 14 during probe inspection or wire bonding connection, thereby preventing a crack from occurring in the electrode pad 14. Specifically, a probe inspection region or a wire bonding connection region may be set in a portion of the electrode pad 14 which is located at a center of the opening portion.

Figure 3A:
FIGS. 3A to 3D are plan views each showing a portion of a semiconductor device according to a variation of the first embodiment of the present disclosure.

Also, in this embodiment, each contact wiring 11B is in the shape of a rectangle. Alternatively, for example, corner portions of the rectangle may be beveled as shown in FIG. 3A, which can provide the following effect. Specifically, when the first opening portion 12a is formed in the first protective insulating film 12, a surface portion of the fourth inter-layer insulating film 10 around each contact wiring 11B is slightly etched. However, if the corner portions of each contact wiring 11B are beveled, it is possible to prevent an acute angle portion from occurring in a step-like shape caused by the etching, resulting in an improvement in the coverage of the barrier metal film 13 or the coverage of a metal film included in the electrode pad 14. Therefore, it is possible to prevent a crack from occurring in the electrode pad 14, and in addition, it is possible to prevent a component metal (e.g., Cu) of the contact wirings 11B from precipitating to the electrode pad 14, i.e., it is possible to prevent corrosion of the electrode pad 14. For a similar reason, the first opening portion 12a of the first protective insulating film 12 is preferably in the shape of a rectangle whose corner portions are beveled.

Figure 3B:
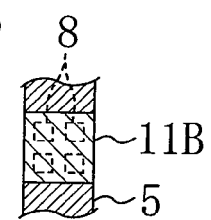

Also, in this embodiment, each contact wiring 11B is electrically connected to the lower-layer wiring 5 via the corresponding single via plug 8. Instead of this, for example, each contact wiring 11B may be electrically connected to the lower-layer wiring 5 via a plurality of via plugs 8 as shown in FIG. 3B.

Figure 3C:
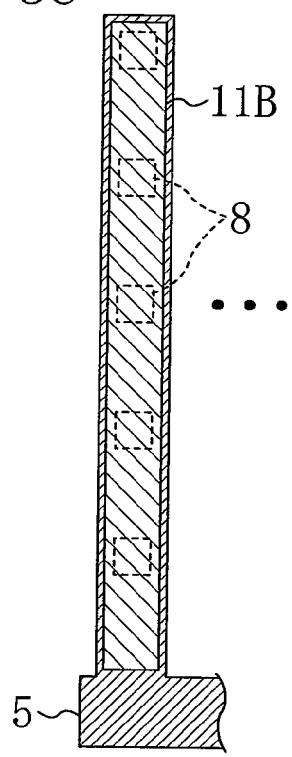

Also, in this embodiment, each contact wiring 11B is in the shape of a rectangle. The shape of the contact wiring 11B is not particularly limited. Alternatively, for example, a contact wiring 11B may be in the shape of a line as shown in FIG. 3C. In this case, a contact area of the contact wiring 11B and the electrode pad 14 (more exactly, the barrier metal film 13) increases, and therefore, the reliability of electrical connection between the contact wiring 11B and the electrode pad 14 is improved. Note that the arrangement of a plurality of minute rectangle-shaped contact wirings 11B as in this embodiment can provide the following effect. Specifically, if a plurality of relatively small contact wirings 11B are arranged below a center portion of an opening portion (the first opening portion 12a of the first protective insulating film 12), a large number of minute recess portions are formed in a surface of the electrode pad 14 at the center portion of the opening portion due to a step between the contact wirings 11B and the fourth inter-layer insulating film 10 therearound. Therefore, by connecting a bonding wire to a surface of the electrode pad 14 at the center portion of the opening portion, adhesiveness between the electrode pad 14 and the bonding wire can be improved. Note that, in order to enhance this effect, contact wirings of about 0.5 μm×0.5 μm may be formed instead of the contact wirings 11B of 0.3 μm×0.3 μm of this embodiment.

Figure 3D:
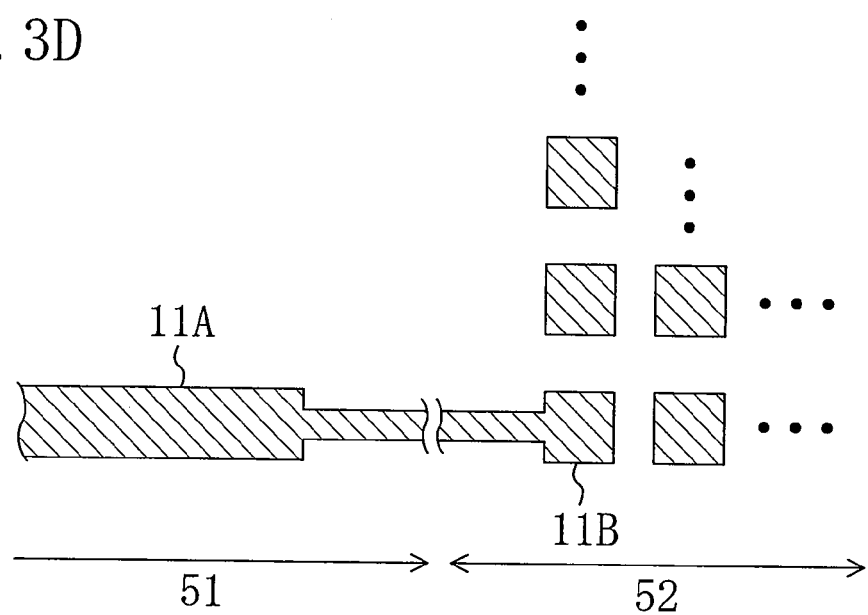

Also, in this embodiment, each contact wiring 11B is electrically connected to the lower-layer wiring 5 via the corresponding via plug 8. Instead of this, for example, the contact wirings 11B may be electrically connected to the upper-layer wiring 11A in the same wiring layer as shown in FIG. 3D. In this case, the via plugs 8 (i.e., the lower-layer wiring 5) may not be provided below the contact wirings 11B.

Also, in this embodiment, the first inter-layer insulating film 2, the second inter-layer insulating film 4, the third inter-layer insulating film 7, and the fourth inter-layer insulating film 10 are each made of a $SiO_2$ film (silicon oxide film). Instead of this, for example, an oxide insulating film, such as a TEOS oxide film made of TEOS (tetraethylorthosilicate) or the like, a carbon-doped silicon oxide film (SiOC film), or a low-k constant insulating film, such as a fluorine-doped silicon oxide film (FSG film) or the like, may be employed.

Also, in this embodiment, the first underlying insulating film 3, the second underlying insulating film 6 and the third underlying insulating film 9 are each made of a SiN film (silicon nitride film). The present disclosure is not limited to this. An insulating film which is more highly resistant to moisture than the inter-layer insulating film and can prevent moisture intrusion (i.e., the film has a barrier property) can be employed. Examples of the insulating film include nitride insulating films, such as a silicon carbon nitride film (SiCN film), a silicon oxynitride film (SiON film), and the like.

Also, in this embodiment, the lower-layer wiring 5, the via plug 8, the upper-layer wiring 11A and the contact wiring 11B are each made of copper (Cu). Instead of this, for example, a copper alloy, such as Cu—Al or the like, which includes copper as a major component and a small amount of aluminum may be employed. Note that, when the lower-layer wiring 5, the via plug 8, the upper-layer wiring 11A and the contact wiring 11B are each made of copper or a copper alloy, a barrier metal film including, for example, a TaN film is preferably formed before filling a wiring trench or a via with copper or a copper alloy.

Also, in this embodiment, the first protective insulating film 12 and the second protective insulating film 15 are each made of a SiN film. Instead of this, a multilayer film including a SiN film and a TEOS oxide film may be employed.

Also, in this embodiment, the electrode pad 14 is made of aluminum. Instead of this, for example, a copper alloy, such as Al—Si, Al—Cu, Al—Si—Cu or the like, which includes aluminum as a major component and a small amount of silicon or copper, may be employed.

Second Embodiment

Hereinafter, a semiconductor device according to a second embodiment of the present disclosure will be described with reference to the drawings.

Figure 4A:
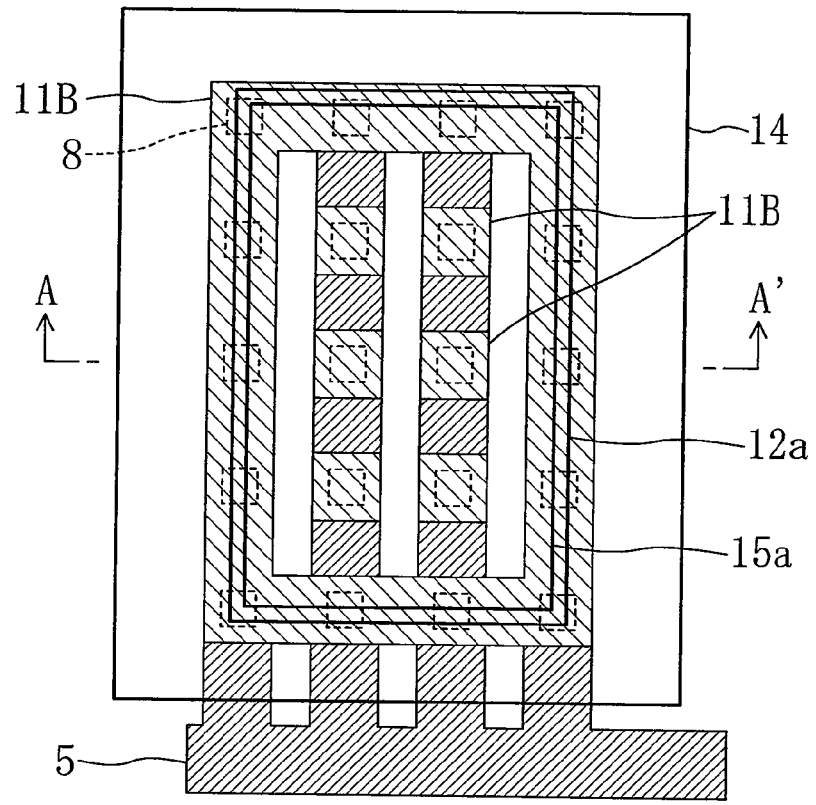
FIGS. 4A and 4B are a plan view and a cross-sectional view showing a pad structure of a semiconductor device according to a second embodiment of the present disclosure, respectively.
Figure 4B:
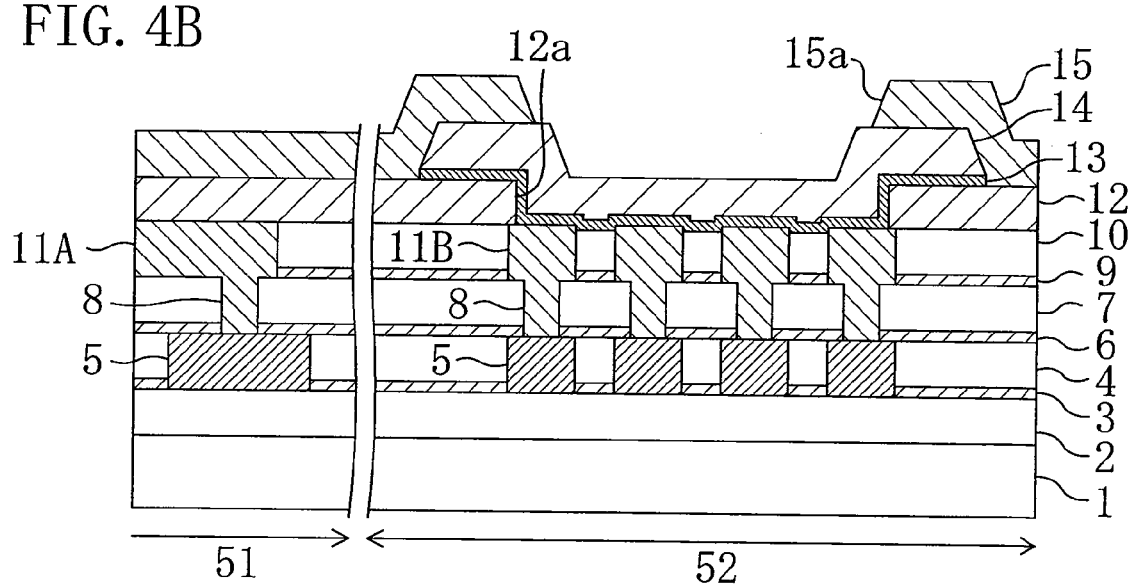

FIGS. 4A and 4B are a plan view and a cross-sectional view showing a pad structure of the semiconductor device of this embodiment, respectively. Note that FIG. 4A mainly shows a wiring structure below an electrode pad. FIG. 4B shows a cross-sectional structure taken along line A-A' of FIG. 4A (a cross-sectional structure of a pad arrangement region 52), and in addition, a cross-sectional structure of a cell region 51. In FIGS. 4A and 4B, the same components as those of the semiconductor device of the first embodiment shown in FIGS. 2A and 2B are indicated by the same reference symbols and the same description will not be repeated.

The semiconductor device of this embodiment is different from that of the first embodiment in that, as shown in FIGS. 4A and 4B, a ring-shaped contact wiring 11B is provided along an edge of the first opening portion 12a of the first protective insulating film 12.

According to this embodiment, the following effect can be obtained in addition to an effect similar to that of the first embodiment. Specifically, when probe inspection is performed with respect to the electrode pad 14, then even if a crack occurs in the barrier metal film 13 or the electrode pad 14 and moisture intrudes through the crack, the structure in which the first opening portion 12a of the first protective insulating film 12 is surrounded by the ring-shaped contact wiring 11B and the third underlying insulating film 9 can prevent the moisture from intruding further inside the chip. Therefore, the moisture resistance of the device can be ensured. Moreover, the ring-shaped contact wiring 11B is arranged in a manner which allows it to overlap an edge of the first opening portion 12a of the first protective insulating film 12, and therefore, the ring-shaped contact wiring 11B functions as an etch-stop when the first opening portion 12a is formed. Therefore, a step below the edge of the first opening portion 12a can be reduced, and therefore, the coverage of the barrier metal film 13 and the coverage of a metal film included in the electrode pad 14 can be improved. Therefore, it is possible to prevent a crack from occurring in the electrode pad 14, and in addition, it is possible to prevent a component metal of the contact wirings 11B from precipitating to the electrode pad 14, i.e., it is possible to prevent corrosion of the electrode pad 14.

Note that, in this embodiment, smaller rectangle-shaped contact wirings 11B are provided inside the ring-shaped contact wiring 11B. Instead of this, the rectangle-shaped contact wirings 11B may not be provided. In this case, a portion of the electrode pad 14 which is located above a region where no contact wiring 11B is provided, i.e., a portion of the electrode pad 14 which is located at a center portion of the first opening portion 12a of the first protective insulating film 12, may be used as a probe inspection region or a wire bonding connection region.

Third Embodiment

Hereinafter, a semiconductor device according to a third embodiment of the present disclosure will be described with reference to the drawings.

Figure 5A:
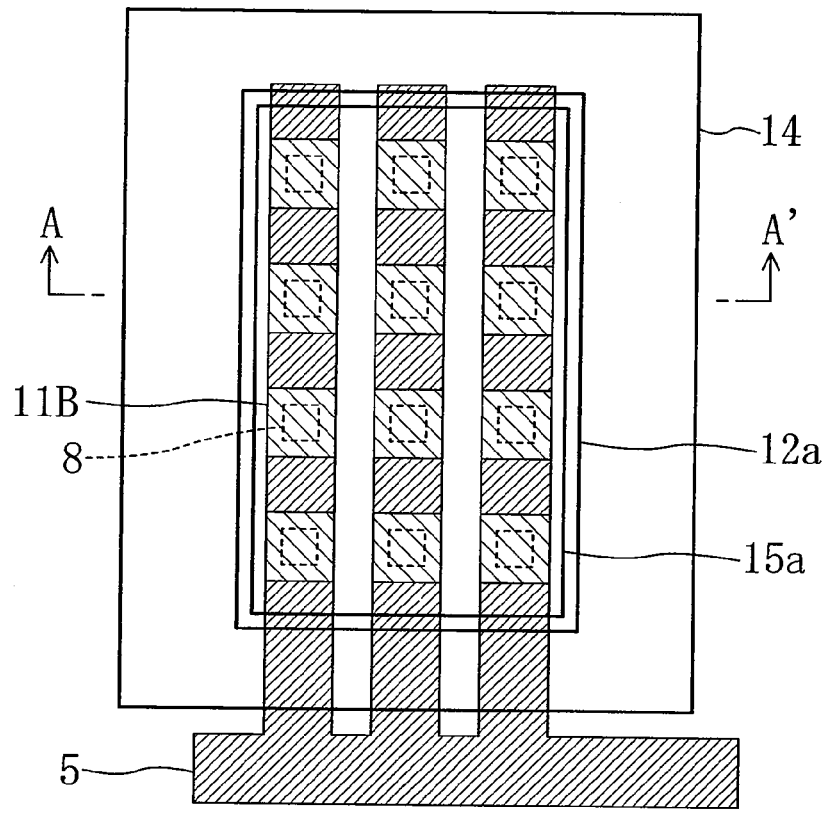
FIGS. 5A and 5B are a plan view and a cross-sectional view showing a pad structure of a semiconductor device according to a third embodiment of the present disclosure, respectively.
Figure 5B:
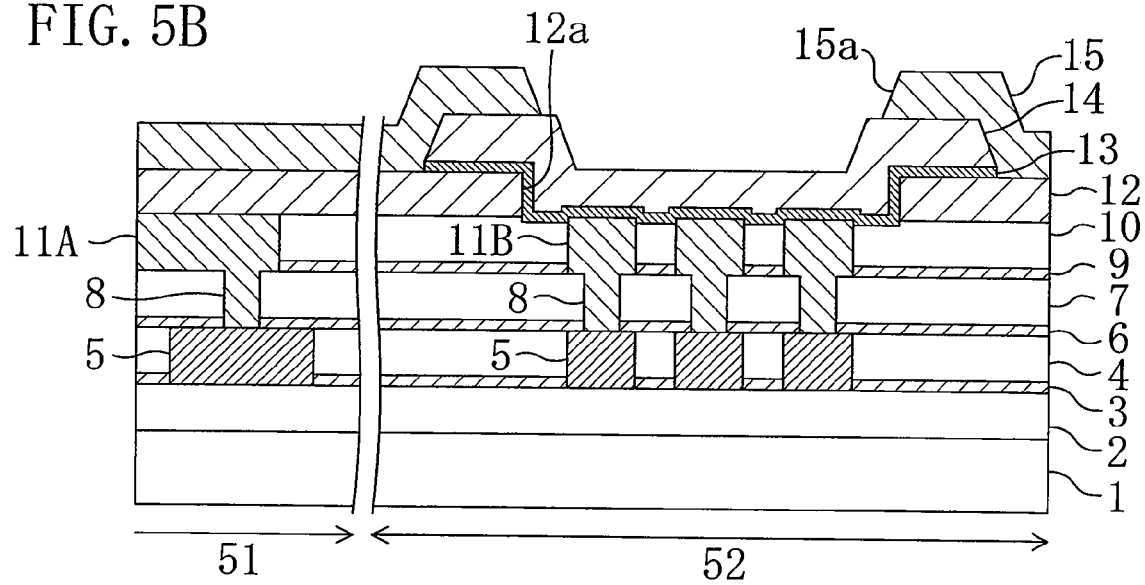

FIGS. 5A and 5B are a plan view and a cross-sectional view showing a pad structure of the semiconductor device of this embodiment. Note that FIG. 5A mainly shows a wiring structure below an electrode pad. FIG. 5B shows a cross-sectional structure taken along line A-A' of FIG. 5A (a cross-sectional structure of a pad arrangement region 52), and in addition, a cross-sectional structure of a portion of a cell region 51. In FIGS. 5A and 5B, the same components as those of the semiconductor device of the first embodiment shown in FIGS. 2A and 2B are indicated by the same reference symbols and the same description will not be repeated.

The semiconductor device of this embodiment is different from that of the first embodiment in that, as shown in FIGS. 5A and 5B, all contact wirings 11B are arranged in a manner which allows them not to overlap an edge of the first opening portion 12a of the first protective insulating film 12. In other words, all contact wirings 11B are arranged inside the first opening portion 12a.

According to this embodiment, the following effect can be obtained in addition to an effect similar to that of the first embodiment. Specifically, when the first opening portion 12a is formed in the first protective insulating film 12, a surface of the underlying fourth inter-layer insulating film 10 is etched, so that a step below the edge of the first opening portion 12a is increased. As a result, the coverage of the barrier metal film 13 is degraded, however, no contact wiring 11B is provided below the edge of the first opening portion 12a, and therefore, it is possible to prevent a metal included in the contact wirings 11B from precipitating to the electrode pad 14, i.e., it is possible to prevent corrosion of the electrode pad 14.

Fourth Embodiment

Hereinafter, a semiconductor device according to a fourth embodiment of the present disclosure will be described with reference to the drawings.

Figure 6A:
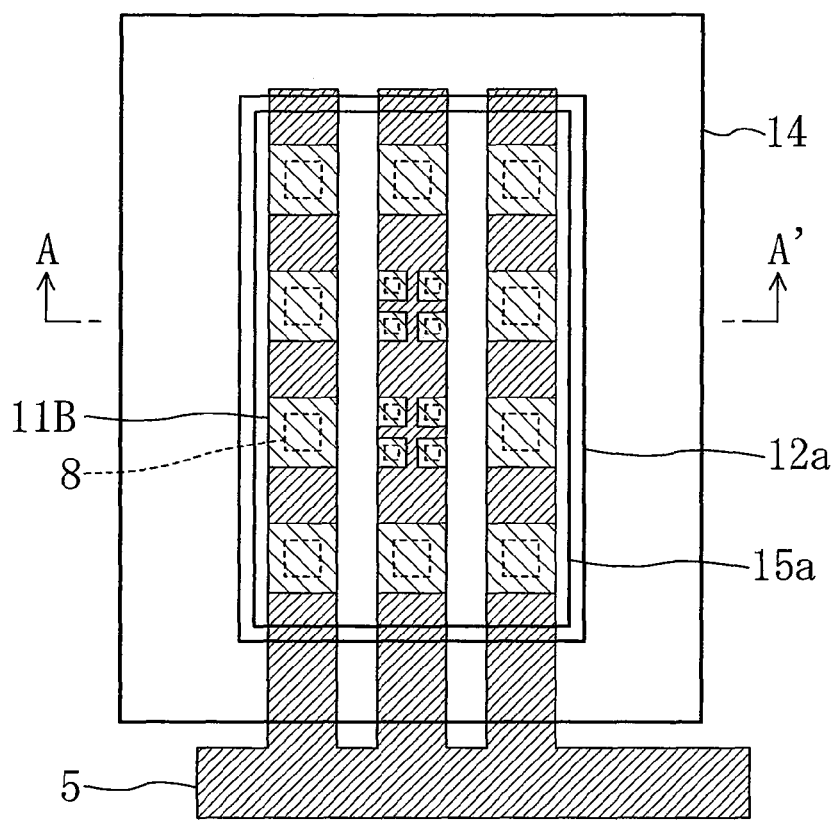
FIGS. 6A and 6B are a plan view and a cross-sectional view showing a pad structure of a semiconductor device according to a fourth embodiment of the present disclosure, respectively.
Figure 6B:
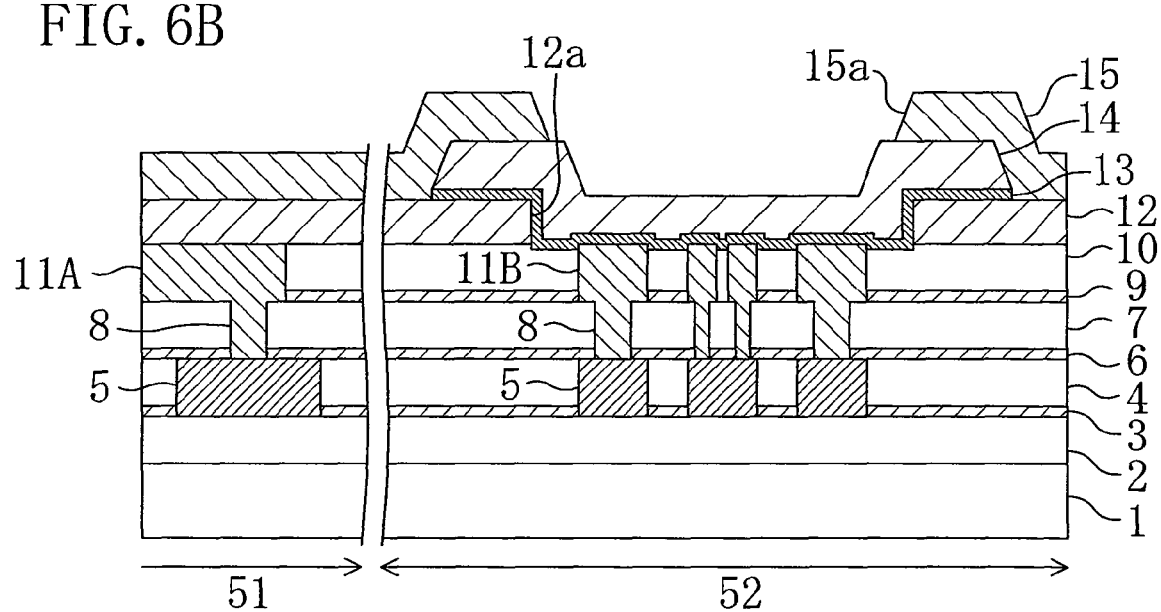
Figure 7:
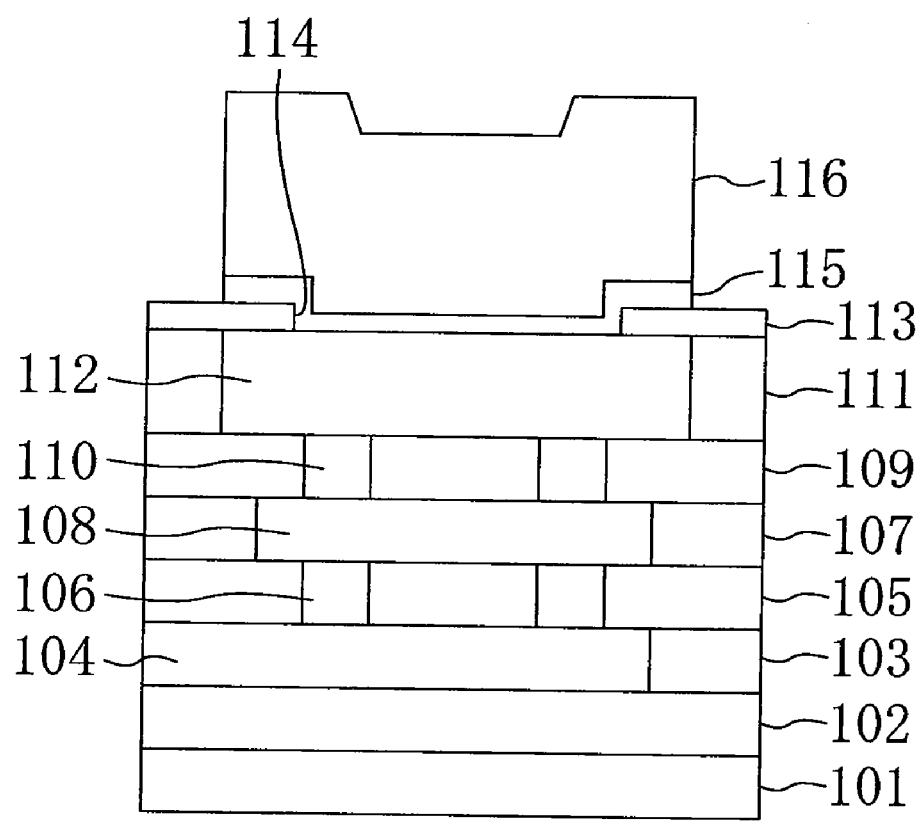
FIG. 7 is a cross-sectional view showing a conventional semiconductor device having an electrode pad structure disclosed in Japanese Unexamined Patent Application Publication No. 2007-123546.

FIGS. 6A and 6B are a plan view and a cross-sectional view showing a pad structure of the semiconductor device of this embodiment. Note that FIG. 6A mainly shows a wiring structure below an electrode pad. FIG. 6B shows a cross-sectional structure taken along line A-A' of FIG. 6A (a cross-sectional structure of a pad arrangement region 52), and in addition, a cross-sectional structure of a portion of a cell region 51. In FIGS. 6A and 6B, the same components as those of the semiconductor device of the first embodiment shown in FIGS. 2A and 2B are indicated by the same reference symbols and the same description will not be repeated.

The semiconductor device of this embodiment is different from that of the first embodiment in an area of each contact wiring 11B as shown in FIGS. 6A and 6B. Specifically, contact wirings 11B having a relatively large area are provided below a peripheral portion of the first opening portion 12a of the first protective insulating film 12, while contact wirings 11B having a relatively small area are provided below a center portion of the first opening portion 12a. Here, the contact wirings 11B with the relatively large area have a size of, for example, about 3 μm×3 μm, while the contact wirings 11B with the relatively small area have a size of, for example, about 0.5 to 1 μm×0.5 to 1 μm.

Note that FIGS. 6A and 6B show how ten contact wirings 11B with the relatively large area are provided below the peripheral portion of the first opening portion 12a of the first protective insulating film 12, and eight contact wirings 11B with the relatively small area are provided below the center portion of the first opening portion 12a. However, actually, if the first opening portion 12a (i.e., the electrode pad 14) is assumed to have a size of about 50 to 100 μm×50 to 100 μm, several hundreds of large and small contact wirings 11B having the aforementioned sizes are arranged.

According to this embodiment, the following effect can be obtained in addition to an effect similar to that of the first embodiment. Specifically, when the first opening portion 12a is formed in the first protective insulating film 12, a surface portion of the fourth inter-layer insulating film 10 around the contact wirings 11B is removed by etching, so that an upper portion of each contact wiring 11B protrudes from the fourth inter-layer insulating film 10. Therefore, a protruding portion corresponding to an underlying shape is formed in a surface of the electrode pad 14 above each protruding contact wiring 11B. Therefore, if a plurality of relatively small contact wirings 11B are provided below a center of the first opening portion 12a, a large number of minute recess portions are generated in a surface of the electrode pad 14 at a center of the first opening portion 12a due to a step between the contact wirings 11B and the fourth inter-layer insulating film 10 therearound. Therefore, by connecting a bonding wire to the surface of the electrode pad 14 at the center of the first opening portion 12a, adhesiveness between the electrode pad 14 and the bonding wire can be improved.

Note that, in this embodiment, all the contact wirings 11B are arranged in a manner which allows them not to overlap the edge of the first opening portion 12a of the first protective insulating film 12 as in the third embodiment, and therefore, an effect similar to that of the third embodiment can be obtained. Note that, also in this embodiment, outermost contact wirings 11B may be arranged in a manner which allows them to overlap the edge of the first opening portion 12a of the first protective insulating film 12 as in the first embodiment. Moreover, in this case, if a ring-shaped contact wiring 11B is provided along the edge of the first opening portion 12a of the first protective insulating film 12 in a manner which allows the ring-shaped contact wiring 11B to overlap the edge, an effect similar to that of the second embodiment can be obtained.

What is claimed is:

1. A semiconductor device comprising:
   an insulating film formed on a semiconductor substrate;
   a plurality of contact wirings including copper formed in the insulating film so that the plurality of contact wirings are separated from one another;
   a protective film formed on the plurality of contact wirings and the insulating film;
   an opening portion formed in the protective film, the plurality of contact wirings being exposed through the opening portion; and
   an electrode pad formed in the opening portion, the electrode pad being electrically connected to the plurality of contact wirings,
   wherein there are no insulating films between the insulating film and a part of the electrode pad located directly below the opening portion, and
   an upper surface of a part of the insulating film located below the opening portion is lower than an upper surface of at least one of the plurality of the contact wirings.

2. The semiconductor device of claim 1, wherein at least one of the plurality of contact wirings is in the shape of a ring.

3. The semiconductor device of claim 2, wherein the ring-shaped contact wiring overlaps an edge of the opening portion.

4. The semiconductor device of claim 1, wherein the plurality of contact wirings do not overlap an edge of the opening portion.

5. The semiconductor device of claim 1, wherein the plurality of contact wirings include a first contact wiring, and a second contact wiring smaller than the first contact wiring.

6. The semiconductor device of claim 5, wherein the first contact wiring is provided below a peripheral portion of the opening portion, and the second contact wiring is provided below a center portion of the opening portion.

7. The semiconductor device of claim 1, wherein at least one of the plurality of contact wirings is in the shape of a rectangle whose corner portions are beveled.

8. The semiconductor device of claim 1, wherein
   a lower-layer wiring is formed between the semiconductor substrate and the insulating film,
   at least one of the plurality of the contact wirings and the lower-layer wiring are connected with a via, and
   in a surface in which the at least one of the plurality of the contact wirings and the via are connected together, an area of the at least one of the plurality of the contact wirings is larger than that of the via.

9. The semiconductor device of claim 8, wherein the lower-layer wiring extends to a region outside the opening portion.

10. The semiconductor device of claim 1, wherein
    the plurality of contact wirings are made of copper or a copper alloy, and
    the electrode pad is made of aluminum or an aluminum alloy.

11. The semiconductor device of claim 1, wherein at least one of the plurality of the contact wirings substantially has a quadrilateral shape.

12. The semiconductor device of claim 1, wherein at least one of the plurality of the contact wirings substantially has a square shape.

13. The semiconductor device of claim 1, wherein
    a wiring is formed in a part of the insulating film located in a region outside the opening portion, and
    a width of the wiring is larger than a width of each of the plurality of the contact wirings.

* * * * *